(12) United States Patent
Hayashi et al.

(10) Patent No.: US 6,534,791 B1
(45) Date of Patent: Mar. 18, 2003

(54) EPITAXIAL ALUMINIUM-GALLIUM NITRIDE SEMICONDUCTOR SUBSTRATE

(75) Inventors: Nobuaki Hayashi, Aichi (JP); Tetsuya Takeuchi, Mountain View, CA (US); Hiroshi Amano, Aichi (JP); Isamu Akasaki, Aichi (JP)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/856,724

(22) PCT Filed: Nov. 24, 1999

(86) PCT No.: PCT/US99/27974

§ 371 (c)(1),
(2), (4) Date: Sep. 6, 2001

(87) PCT Pub. No.: WO00/33364

PCT Pub. Date: Jun. 8, 2000

(30) Foreign Application Priority Data

Nov. 27, 1998 (JP) .............................. 10-353850

(51) Int. Cl.[7] .................. H01L 29/06; H01L 33/00
(52) U.S. Cl. ............... 257/76; 257/22; 257/103; 257/192; 257/197; 257/613; 257/615; 257/190
(58) Field of Search ............... 257/12, 22, 190, 257/615, 613, 76, 103, 192, 197

(56) References Cited

U.S. PATENT DOCUMENTS

| | | | |
|---|---|---|---|
| 5,182,670 A | * | 1/1993 | Khan et al. |
| 5,290,393 A | * | 3/1994 | Nakamura .................. 117/89 |
| 5,863,811 A | | 1/1999 | Kawai et al. ................ 438/47 |

FOREIGN PATENT DOCUMENTS

| | | |
|---|---|---|
| EP | 0 497 350 A | 8/1992 |
| EP | 0 497 350 B1 | 8/1995 |
| JP | 4 297023 A | 10/1992 |
| JP | 09 018092 A | 1/1997 |
| JP | 10173228 | * 6/1998 |

OTHER PUBLICATIONS

Abstract, H4–297023, Shuji Nakamura, Oct. 21, 1992, 1 page.
Patent Abstracts of Japan, Pub. No. 09199759 A, Date of Publication Jul. 31, 1997, 1 page.
Patent Abstracts of Japan, Pub. No. 07235692 A, Date of Publication Sep. 5, 1995, 1 page.
Patent Abstracts of Japan, Pub. No. 10256666 A, Date of Publication Sep. 25, 1998, 1 page.
Patent Abstracts of Japan, Pub. No. 11162847 A, Date of Publication Jun. 18, 1999, 1 page.
A. Usui et al., "Thick GaN Epitaxial Growth with Low Dislocation Density by Hydride Vapor Phase Epitaxy", Jpn. J. Appl. Phys. vol. 36 (1997), pp. L899–902.
Kenji Uchida et al., Epitaxial Growth of GanN Layers with Double–Buffer Layers, Proceeding of the Second International Conference on Nitride Semiconductors (ICNS'97) p. 214–216.
Naoyuki Takahashi et al., Growth of GaN on GaAs (111)B by Metalorganic Hydrogen ChlorideVPE Using Double Buffer layer, Jpn.J.Appll.Phys. vol. 36(1997) pp. L1133–L1185.

(List continued on next page.)

*Primary Examiner*—Minh Loan Tran
*Assistant Examiner*—Tan Tran
(74) *Attorney, Agent, or Firm*—Patent Law Group LLP; Brian D. Ogonowsky; Rachel V. Leiterman

(57) ABSTRACT

A nitride semiconductor epitaxial substrate includes a low-temperature-deposited buffer layer, the composition of which is $Al_xGa_{1-x}N$, where $0 \leq x \leq 1$, and a single crystalline layer, the composition of which is $Al_yGa_{1-y}N$, where $0 > y \leq 1$. The single crystalline layer is deposited directly over the low-temperature-deposited buffer layer, wherein the buffer layer has a mole fraction x satisfying $(y-0.3) \leq x > y$.

7 Claims, 1 Drawing Sheet

OTHER PUBLICATIONS

Shuji Nakamura et al., "InGaN/GaN/AlGaN–based laser Diodes with modulation–doped strained–layer superlattices grown on an epitaxially laterally overgrown GaN substrate", Appl.Phys., vol. 72(1998), pp. 211–213.

K. Ito et al., "Preparation of $Al_xGa_{1-x}N$/GaN Heterostructure by MOVPE", Journal of Crystal Growth 104 (1990), pp. 533–538.

International Search Report, 2 pages.

* cited by examiner

EPITAXIAL ALUMINIUM-GALLIUM NITRIDE SEMICONDUCTOR SUBSTRATE

TECHNICAL FIELD

The present invention relates generally to semiconductor deposition substrates and more particularly to Group III nitride semiconductor deposition substrates and a method for forming same.

BACKGROUND OF THE INVENTION

In the past Group III nitride semiconductor deposition substrates have been used for laser diodes, modulation doped field effect transistors, ridge wave-guide laser diodes p-n junction type photo-detectors, semiconductor multi-layer reflective films, and sub-band transition devices. Also, high efficiency, short wavelength lasers have been developed using Group III nitride semiconductors containing aluminum (Al), gallium (Ga), indium (In), and nitrogen (N), and having the general structural formula of $Al_xGa_{1-x-y}In_yN$ (where x and y are mole fractions). However, the wafer size of the single crystalline Group III nitride semiconductors has been small so far because it has been difficult to grow large scale bulk crystals of these materials. In order to attain an acceptable wafer size, Group III nitride semiconductor deposition substrates have been used, which are formed by the deposition of the Group III nitride semiconductors on top of substrates of materials such as sapphire ($Al_2O_3$), silicon carbide (SiC), spinel (MgO), gallium arsenide (GaAs), or silicon (Si).

However, this solution has not been entirely satisfactory because there are considerable lattice mismatches and differences in coefficients of thermal expansion between the different types of substrates and the Group III nitride semiconductors. For example, the lattice mismatching is 11% to 23%, and the difference in coefficients of thermal expansion is approximately $2*10^{-6} K_{-1}$ between a sapphire substrate and a typical Group III nitride semiconductor. Consequently, Group III nitride semiconductor layers, which consist of a thin film of the Group III nitride semiconductor deposited on different types of substrate, have poor crystal quality, as well as poor electrical and optical properties.

There have been numerous attempts to improve the crystal quality of the Group III nitride semiconductor layers deposited or grown on the various substrates. One of the most effective methods has been to obtain a multi-layer deposition substrate by growing several pairs of single crystalline layers and low-temperature-deposited buffer layers of Group III nitride semiconductor on different types of substrates. Here a low-temperature-deposited buffer layer is one which is deposited at a temperature at which single crystals do not grow.

There are a number of different types of low-temperature-deposited buffer layers, such as those in which single crystallization of the buffer layers is carried out to the desired extent prior to the growth of the next single crystal after deposition.

Occasionally, it is necessary to grow aluminum gallium nitride ($Al_xGa_{1-x}N$, where x is a mole fraction from zero to one ($0 \leq x \leq 1$)) on underlying Group III nitride semiconductor deposition layers. A number of different techniques have been developed for accomplishing this.

In Japanese Laid-Open Patent Application No. H 4-297023 to Nakamura, a single crystalline layer of a gallium nitride (GaN)-based semiconductor, grown on a buffer layer of gallium aluminum nitride ($Ga_xAl_{1-x}N$, where x is a mole fraction, $0 \leq x \leq 1$) at a temperature at which single crystals will not grow on the substrate, yielded a single crystalline layer of a higher quality, GaN-based semiconductor than when a single crystalline layer of a GaN-based semiconductor was grown on an aluminum nitride (AlN) buffer layer. Nakamura goes on to say that when a GaN thin film was grown on a substrate, the advantages of using a GaN buffer layer, rather than an AlN buffer layer, included:

(1) single crystallization that occurred more readily even when the temperature rose because of the lower melting point (therefore, the benefits of the buffer layer were realized even if the buffer layer was made thicker); and (2) an increase in crystal quality since the material being grown was the same as the material on which it was grown (e.g., when an epitaxial layer of GaN was grown over the GaN buffer layer).

In Japanese Laid-Open Patent Application No. H 9-199759, Akasaki et al. disclosed a technique in which a low-temperature-deposited buffer layer, formed at a temperature at which single crystals will not grow, and a single crystalline layer, formed at a temperature at which single crystals will grow, were alternately built up in three or more pairs on a substrate of a different material. The targeted Group III nitride semiconductor layer was then formed over the top-most single crystal layer at a temperature at which single crystals grow. A working example was disclosed in which an AlN low-temperature-deposited buffer layer (deposition temperature of 400° C. and a thickness of 50 nm) and a GaN single crystalline layer (at a deposition temperature of 1150° C. and a film thickness of 300 nm) was alternately built up in three layers each. The uppermost GaN single crystalline layer in Akasaki was grown to a thickness of 1.5 μm and was etched with potassium hydroxide (KOH). The etch pit density was measured from a scanning electron micrograph and found to be $4*10^7$ cm$^{-2}$, after the deposition of one layer pair on a sapphire substrate and $8*10^5$ cm$^{-2}$ when three layer pairs were deposited.

In Japanese Laid-Open Patent Application No. H 7-235692, Sato disclosed a technique for improving the crystal quality of a single crystalline layer grown by using a plurality of low-temperature-deposited buffer layers. A working example was disclosed in which AlN low-temperature-deposited buffer layers and AlGaN low-temperature-deposited buffer layers were consecutively deposited on a sapphire substrate, over which a GaN single crystalline layer was grown to a thickness of 4 μm. The low-temperature-deposited buffer layers were not limited to AlGaN low-temperature-buffer layers and could have been any one of those whose lattice constant was between that of sapphire and GaN.

In Japanese Laid-Open Patent Application No. H 10-256666, Uchida proposed making the deposition temperature of the low-temperature-deposited buffer layers deposited first higher than that of the low-temperature-deposited buffer layers subsequently deposited for improving the crystal quality of a single crystalline layer grown by using a plurality of low-temperature-deposited buffer layers.

In Japanese Laid-Open Patent Application No. H 11-162847, Amano et al. disclosed the basic process of alternately growing multiple layers on the same or different type of substrate of a low-temperature-deposited buffer layer, formed at a temperature at which single crystals will not grow, and a single crystalline layer formed at a temperature at which single crystals will grow.

In Japanese Patent Application No. H 10-313993, Takeuchi et al. disclosed a nitride semiconductor laser element, including a low-temperature-deposited buffer layer containing AlN and a nitride semiconductor single crystalline layer containing AlN and grown directly on the low-temperature-deposited buffer layer as an over 1-μm-thick cladding layer, which provided a single-peak far field pattern.

In Japanese Patent Application No. H 10-322859, Iwaya et al. disclosed that when a GaN single crystalline layer was grown, cracking occurred by the ninth layer pair if a GaN low-temperature-deposited buffer layer was used, but no cracking occurred even with twelve layer pairs if an AlN low-temperature-deposited buffer layer was used. If an AlN low-temperature-deposited buffer layer was used, the in-plane strain of the GaN single crystalline layer was compressive strain and was nearly constant with respect to the number of layer pairs so it was believed that even more layers could be built up without cracking.

Although there has been a great deal of study in this area, there is a need for improvement of the crystal quality of an AlGaN deposition substrate. In particular AlN single crystals are greatly prone to cracking. Using high crystal quality deposition substrates without the cracks means that performances can be enhanced for light emitting and detecting devices that use AlGaN and their yields can also be greatly increased. Further, shorter wavelength (250 to 400 mn) light emitting and detecting elements can be produced by using AlGaN that has a high AlN molar fraction. Even further, AlGaN/GaN multi-layer reflectors (Distributed Bragg Reflectors) with no cracks and extremely high reflectance could be produced.

DISCLOSURE OF THE INVENTION

The present invention provides a multi-layer deposition substrate formed by the deposition of a low-temperature-deposited buffer layer of aluminum gallium nitride (AlGaN) the composition of which is $Al_xGa_{1-x}N$ (where x is a mole fraction from zero to one ($0 \leq x \leq 1$)) on a sapphire or nitride semiconductor substrate, and a single crystalline aluminum gallium nitride (AlGaN) layer, the composition of which is $Al_yGa_{1-y}N$ (where y is a mole fraction from above zero to one ($0 < y \leq 1$)), which is deposited directly over the low-temperature-deposited $Al_xGa_{1-x}N$ buffer layer. The multi-layer deposition substrate is characterized so that x is greater than the greater of 0 and y−0.3, and the deposition substrate does not have cracks in this case.

The present invention further provides a multi-layer deposition substrate formed by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 \leq y \leq 1$), which is deposited directly over the low-temperature-deposited buffer layer. The multi-layer deposition substrate is characterized so that x is greater than the greater of 0 and y−0.2 in order to absolutely prevent cracking.

The present invention further provides a multi-layer deposition substrate formed by the deposition of a low-temperature-deposited AlGaN buffer layer, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is characterized so that y is equal to x in order to obtain better crystal quality of single crystals.

The present invention further provides a multi-layer deposition substrate formed by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is characterized so that x is between y−0.1 and y−0.3 in order to keep the molar fraction of AlN small and to keep the resistance of the multi-layer substrate relatively low. It is further desirable for x to be between y−0.1 and y−0.2 in order to prevent cracking.

The present invention further provides a multi-layer deposition substrate formed by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is characterized so that x is equal to y−0.2 whereby there will be no cracking and a nitride semiconductor deposition substrate with low resistance will be formed.

The present invention further provides a multi-layer deposition substrate formed by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is characterized so that y is less than 1 and x is at least 0.05.

The present invention further provides a method for forming a multi-layer deposition substrate by the deposition of a low-temperature-deposited buffer layer of aluminum gallium nitride (AlGaN) the composition of which is $Al_xGa_{1-x}N$ (where x is a mole fraction from zero to one ($0 \leq x \leq 1$)) on a sapphire or nitride semiconductor substrate, and a single crystalline aluminum gallium nitride (AlGaN) layer, the composition of which is $Al_yGa_{1-y}N$ (where y is a mole fraction from above zero to one ($0 < y \leq 1$)), which is deposited directly over the low-temperature-deposited $Al_xGa_{1-x}N$ buffer layer. The multi-layer substrate is formed so that x is greater than the greater of 0 and y−0.3, and the deposition substrate does not have cracks in this case.

The present invention further provides a method for forming a multi-layer deposition substrate by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is formed so that x is greater than the greater of 0 and y−0.2 in order to absolutely prevent cracking.

The present invention further provides a method for forming a multi-layer deposition substrate by the deposition of a low-temperature-deposited AlGaN buffer layer, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the lowtemperature-deposited buffer layer. The multi-layer deposition substrate is formed so that y is equal to x in order to obtain better crystal quality of single crystals.

The present invention further provides a method for forming a multi-layer deposition substrate by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is formed so that x is between y−0.1 and y−0.3 in order to keep the molar fraction of AlN small and to keep the resistance of the multi-layer substrate relatively low. It is further desirable for x to be between y−0.1 and y−0.2 in order to prevent cracking.

The present invention further provides a method for forming a multi-layer deposition substrate by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is formed so that x is equal to y−0.2 whereby there will be no cracking and a nitride semiconductor deposition substrate with low resistance will be formed.

The present invention further provides a method for forming a multi-layer deposition substrate by the deposition of a low-temperature-deposited buffer layer of AlGaN, the composition of which is $Al_xGa_{1-x}N$ (where x is a mole fraction, $0 \leq x \leq 1$), on a sapphire or nitride semiconductor substrate and a single crystalline layer of AlGaN, the composition of which is $Al_yGa_{y-1}N$ (where y is a mole fraction, $0 < y \leq 1$), which is deposited directly over the low-temperature-deposited buffer layer. The multi-layer deposition substrate is formed so that y is less than 1 and x is at least 0.05.

The above and other advantages of the present invention will become apparent to those skilled in the art from a reading of the following detailed description when taken in conjunction with the accompanying drawings.

BEST MODE FOR CARRYING OUT THE INVENTION

Figure 1:
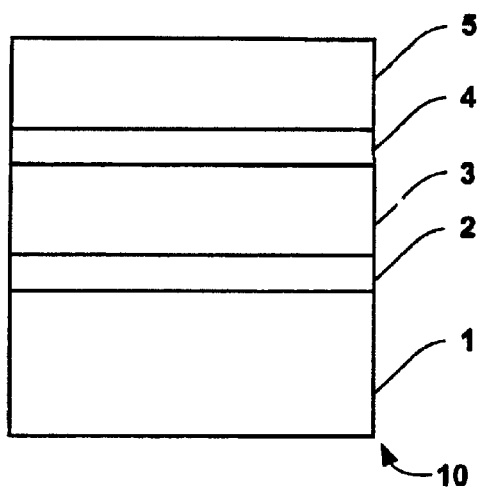
FIG. 1 is a diagram of the structure of the deposition substrate of the present invention.

Referring now to FIG. 1 therein is shown a deposition substrate 10. The deposition substrate 10 includes a (0001) plane sapphire ($Al_2O_3$) substrate 1. On top of the sapphire substrate 1 is a gallium nitride (GaN) low-temperature-deposition buffer layer 2 and a GaN single crystalline layer 3. Above the GaN single crystalline layer is an aluminum gallium nitride ($Al_xGa_{1-x}N$) low-temperature-deposited buffer layer 4 and an aluminum gallium nitride ($Al_yGa_{1-y}N$) single crystalline layer 5.

Figure 2:
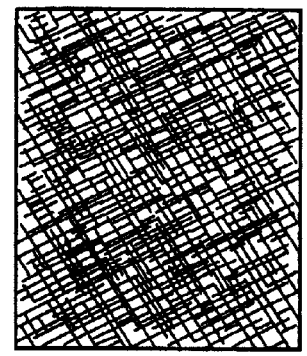
FIG. 2 is an illustration of a Nomarski micrograph of the deposition substrate which consists of a single crystalline $Ga_{(1-y)}AL_yN$ layer grown directly on a sapphire substrate without a low-temperature-deposited buffer layer.

Referring now to FIG. 2 therein is shown an illustration of a Nomarski micrograph of the deposition surface of the $Al_yGa_{1-y}N$ single crystalline layer 5 over the $Al_xGa_{1-x}N$ single crystalline layer without an insertion of the $Al_xGa_{1-x}N$ low-temperature-deposited buffer layer 4 when y=1 and cracks are present.

Figure 3:
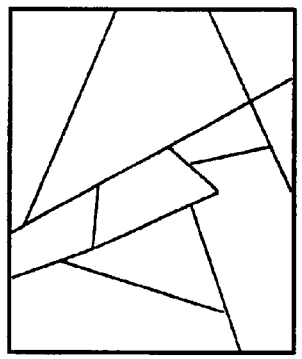
FIG. 3 is an illustration of a Nomarski micrograph of the deposition substrate which consists of a single crystalline AlN (y=1) layer and a low-temperature-deposited $Al_{0.1}Ga_{0.9}N$ (x=0.1) buffer layer grown on a GaN/GaN buffer/sapphire substrate.

Referring now to FIG. 3 therein is shown an illustration of a Nomarski micrograph of the deposition surface of the $Al_yGa_{1-y}N$ single crystalline layer 5 over the $Al_xGa_{1-x}N$ low-temperature-deposited buffer layer 4 when x=0.1 and y=1 and cracks are present.

Figure 4:
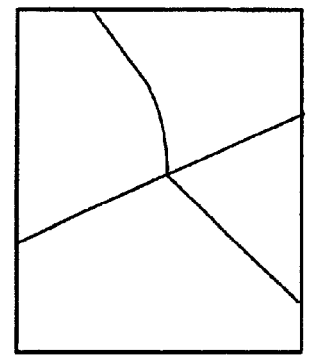
FIG. 4 is an illustration of a Nomarski micrograph of the deposition substrate which consists of a single crystalline $Al_{0.4}Ga_{0.6}N$ (y=0.4) layer and a low-temperature-deposited GaN (x=0) buffer layer grown on a GaN/GaN buffer/sapphire substrate.

Referring now to FIG. 4 therein is shown an illustration of a Nomarski micrograph of the deposition surface of the $Al_yGa_{1-y}N$ single crystalline layer 5 over the $Al_xGa_{1-x}N$ low-temperature-deposited buffer layer 4 when x=0.0 and y=0.4 and cracks are present.

Figure 5:
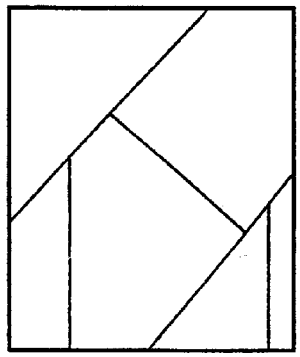
FIG. 5 is an illustration of a Nomarski micrograph of the deposition substrate which consists of a single crystalline $Al_{0.1}Ga_{0.9}N$ (y=0.1) layer and a lower-temperature-deposited GaN (x=0) buffer layer grown on a GaN/GaN buffer/sapphire substrate.

Referring now to FIG. 5 therein is shown an illustration of a Nomarski micrograph of the deposition surface of the $Al_yGa_{1-y}N$ single crystalline layer 5 over the $Al_xGa_{1-x}N$ low-temperature-deposited buffer layer 4 when x=0.0 and y=0.1 and cracks are present.

Figure 6:
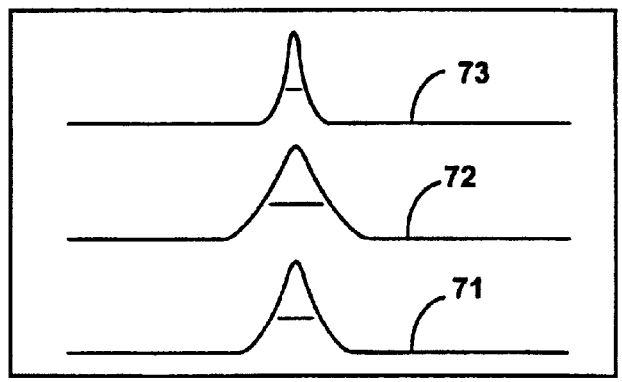
FIG. 6 is a diagram of X-ray diffraction patterns of the single crystalline AlN (y=1) layers in the AlN/GaN/GaN buffer/sapphire deposition substrate, in an AlN/GaN buffer/GaN buffer/sapphire structure, and in an AlN/AlN buffer/GaN/GaN buffer/sapphire substrate.

Referring now to FIG. 6, therein is shown a diagram of the X-ray diffraction patterns for the deposition surface of the $Al_yGa_{1-y}N$ single crystalline layer 5 as shown in FIG. 2. The horizontal axis is the rotational angle of the deposition surface, and the vertical axis is the normalized intensity of the diffracted X-rays corresponding to the rotational angle. Curves 71, 72, and 73 are offset in the vertical axis direction and are plotted to the same scale. The curve 71 corresponds to the pattern of the single crystalline $Ga_{(1-y)}AL_yN$ layers in the AlN (y=1)/GaN/GaN buffer/sapphire deposition substrate, the curve 72 to the pattern of the AlN (y=1)/GaN (x=0) buffer/GaN/GaN buffer/sapphire structure deposition substrate, and the curve 73 to the pattern of an AlN (y=1)/AlN (x=1) buffer/GaN/GaN buffer/sapphire deposition substrate. The full widths of the half-maximums indicated by the curves 71, 72 and 73 are 722 seconds of arc, 784 seconds of arc, and 402 seconds of arc, respectively.

Employing a low-temperature-deposited buffer layer having an x value that is equal to y, as in the above examples, yields a high crystal quality at the deposition surface. These experimental results are contrary to the teaching of Japanese Laid-Open Patent Application No. H 7-235692, Sato, for example.

To determine the above, the following experiment was performed. The steps for manufacturing the deposition substrate 10 in FIG. 1 are given below. In the following steps of the present invention, a crystallization step following deposition is added for the low-temperature-deposited buffer layer.

Step 1. Washing the Substrate:

A two-inch sapphire substrate with a (0001) C plane was etched by being dipped for 5 minutes each in hydrofluoric acid and aqua regia, and then rinsed for 5 minutes in pure water. Organic washing was then performed with methanol and acetone for 5 minutes each, after which the substrate was again rinsed in pure water.

Step 2. Cleaning the Substrate:

After going through the above step at room temperature, the sapphire substrate 1 was transferred to the reactor of a metalorganic vapor phase epitaxy (MOVPE) apparatus. The atmosphere inside the reactor was thoroughly replaced with nitrogen to remove oxygen and water, after which hydrogen was introduced and the sapphire substrate was subjected to hot cleaning for 10 minutes at 1100° C.

Step 3. Forming GaN low-temperature-deposited buffer layer 2:

The temperature of the sapphire substrate 1 was set at 500° C., trimethylgallium (TMGa) and ammonia were supplied to the reactor for approximately 3 minutes, a 30 nm GaN low-temperature-deposited buffer layer 2 was deposited on the sapphire substrate 1, and the supply of the TMGa was then halted, while the supply of the ammonia was continued.

Step 4. Forming GaN single crystalline layer 3:

Upon completion of the deposition of the GaN low-temperature-deposited buffer layer 2, the temperature of the sapphire substrate 1 was raised to 1050° C. over approximately 3 minutes. Approximately 5 minutes later, TMGa was supplied in addition to the ammonia, and the growth of a GaN single crystalline layer 3 was commenced. The supply to TMGa was halted after 1 $\mu$m of deposition at a rate of 2.5 $\mu$m per hour. The temperature of the sapphire substrate 1 was again lowered to 500° C., during which time the supply of ammonia was continued.

Step 5. Forming $Al_xGa_{1-x}N$ low-temperature-deposited buffer layer 4:

The temperature of the sapphire substrate 1 was then set at 500° C., trimethylaluminum (TMAl) and TMGa as well as ammonia were supplied to the reactor for approximately 3 minutes, and a 30 nm AlN low-temperature-deposited buffer layer 4 was deposited on the GaN single crystal layer 3. The composition of the $Al_xGa_{1-x}N$ was changed by varying the ratio of the amount of TMAl and that of TMGa.

Step 6. Forming $Al_yGa_{1-y}N$ single crystalline layer 5:

Upon completion of the deposition of the $Al_xGa_{1-x}N$ low-temperature-deposited buffer layer 4, the supplies of TMAl and TMGa were stopped while the supply of the ammonia was continued. In addition, the temperature of the sapphire substrate 1 was raised to 1050° C. over approximately 3 minutes. Approximately 5 minutes later TMAl, TMGa, and ammonia were supplied, and the growth of an $Al_yGa_{1-y}N$ single crystalline layer 5 was commenced. The supply of TMGa and TMAl was halted after 1 $\mu$m of growth at a rate of 2.5 $\mu$m per hour. The composition of the $Al_xGa_{1-x}N$ was changed by varying the ratio of the amount of TMAl and that of TMGa.

Step 7. Observing the deposition surface of the uppermost AlGaN single crystalline layer 5:

The temperature of the deposition substrate 10 was lowered to room temperature, and the deposition substrate 10 taken out of the reactor and subjected to the required measurements. The measurements comprised observation of the surface by Nomarski micrograph, and measurement of the X-ray diffraction pattern.

In order to show a "reference element", step 5 was omitted from the above-mentioned "experiment", with the procedure moving directly from step 4 to step 6, to produce the FIG. 2 reference element. The FIG. 2 reference element lacks the $Al_xGa_{1-x}N$ low-temperature-deposited buffer layer 4 entirely. In Step 6, y equaled 1. The surface of the FIG. 2 reference element was also observed by Nomarski micrograph, and the X-ray diffraction pattern was measured by X-ray diffraction apparatus.

After observation of surface morpologies of various samples with various AlN molar fractions of single crystal $Al_yGa_{1-y}N$ layers and those of low-temperature-deposited buffer $Al_xGa_{1-x}N$ layers, it can be seen that while cracks appeared when the GaN low-temperature-deposited buffer layer was used, cracking was almost completely suppressed when an AlGaN semiconductor low-temperature-buffer layer containing a suitable amount of AlN was used. The above experimental results are, compiled in Table 1.

TABLE 1

|  | Y = 0.0 | 0.1 | 0.2 | 0.4 | 1.0 |
| --- | --- | --- | --- | --- | --- |
| NONE |  |  |  |  | X 35 |
| X = 0.0 | Nil | X 4 | X 3.5 | X 5 | X 8.5 |
| 0.1 |  | O | O | X 2 | X 3.5 |
| 0.2 |  | O | O | O |  |
| 0.4 |  | O | O | O |  |
| 0.6 |  |  |  |  | X 1.5 |
| 0.8 |  |  |  |  | O |
| 1.0 |  |  |  | O | O |

X, Y: each indicates a respective molar fraction of AlN in the buffer layer and the single crystal layer.
X: cracks observed in a tagged density number of lines/150 $\mu$m
O: no cracks observed
NONE: buffer layers not used and the single crystal layer is formed directly on the GaN/GaN buffer/sapphire Each column in Table 1 expresses the AlN molar fraction y of the top-most single crystalline $Al_yGa_{1-y}N$ layer 5 in the deposition substrates 10, and each row expresses the AlN molar fraction x of the low-temperature-deposited $Al_xGa_{1-x}N$ buffer layer 4 in the deposition substrates 10. The second row from the top, however, corresponds to the deposition substrates lacking the low-temperature-deposited buffer layer 4, such as the FIG. 2 reference element.

Examination of Table 1 shows that the combinations of x and y cannot be selected in an arbitrary manner. The experimental results corresponding to the various combinations of x and y are marked with an O (no cracks in the single crystalline layer 5) or an X (cracks in the single crystalline layer 5). For combinations marked with an X, the crack density is given as the approximate number of cracks per 150 $\mu$m.

The experiments reveal that it is preferable for x to be greater than 0, and for it at least to be greater than y−0.3. For almost no cracks to occur in the single crystalline layer 5, it is preferable for x to be greater than y−0.2. The above-mentioned patent application relating to a nitride semiconductor laser element of Takeuchi et al. (the inventors of the present invention) discloses technology in which it is preferable for x to be greater than 0.05. Therefore, there is an advantage to selecting x in this manner. Another advantages that a $Al_yGa_{1-y}N$ layer substrate of high quality with no cracking can be provided in all the range of AlN molar fractions, 0 ≤ y ≤ 1, since AlGaN layers with appropriate AlN molar fractions are useful to achieve these nitride semiconducter laser elements or other nitride semiconductor elements with the optimized characteristics.

It was also found that the narrowest full widths of the hall-maximum, that is, the best crystal quality, is exhibited when the AlN molar fraction of the AlGaN low-temperature-deposited buffer layer and that of the AlGaN single crystalline layer grown over it are nearly FIG. 6 illustrates an example of an X-ray diffraction pattern where y=1. The X-ray diffraction patterns of curves 71, 72, and 73 are offset in the vertical axis direction and are plotted to the same scale. The curve 71 corresponds to the pattern of the single crystalline AlN layers in the AlN/GaN/GaN buffer/sapphire deposition substrate of a FIG. 2 reference element, the curve 72 to the pattern of the AlN/GaN buffer/GaN/GaN buffer/sapphire substrate, and the curve 73 to the pattern of an AlN/AlN buffer/GaN/GaN buffer/sapphire substrate. The full widths of the half-maximums indicated by the curves 71, 72, and 73 are 722 seconds of arc, 784 seconds of arc, and 402 seconds of arc, respectively.

The thickness of the low-temperature-deposited buffer layer should be at least a specific value at which a stable buffering effect is obtained, and should be no more than another specific value at which a good crystal quality will be maintained for the low-temperature-deposited buffer layer itself and for the nitride semiconductor single crystalline layer. Therefore this thickness should be at least 2 nm and no more than 100 nm, with a range of 10 to 50 nm being even better. The deposition temperature should be selected from a range of 300 to 700° C.

Doping is advantageous in terms of reducing the resistively of the various layer pairs. The resistively relating to the low-temperature-deposited buffer layer can be further reduced if the same type of dopant is used to dope both the low-temperature-deposited buffer layer and the nitride semiconductor single crystalline layer.

It is often best to perform more doping in the low-temperature-deposited buffer layer and promote the decrease in resistively of the low-temperature-deposited buffer layer.

The n-type dopants that can be used include silicon (Si) and germanium (Ge), while p-type dopants include magnesium (Mg), zinc (Zn), and beryllium (Be), with the use of Si or Mg being particularly favorable in terms of their effect of reducing resistance and in that they allow the application of technologically mature methods. The specific resistively of an n-type GaN layer is lower if a high Si concentration is selected, but the crystal quality suffers. Just as with Si, crystal quality will be inferior if the Mg concentration is too high.

The initial substrate does not have to be a sapphire substrate, and the layers can also be grown on SiC, Si, $MgAl_2O_4$ substrate, an AlGaN or similar thin film or substrate so element characteristics and cost can be taken into account.

It is preferable for the thickness of the single crystalline layer to be between 0.1 and 3 $\mu$m. Thinner is better because the manufacturing time will be shorter, but crystal quality will be inferior if the layer is too thin. The growth temperature is selected from a range of 1000 to 1200° C.

The above experiments involved the exclusive use of a metalorganic vapor phase epitaxally (MOVPE) apparatus. There does not seem to be any difficulty in using other apparatuses with the present invention, but when maturity of the technology, ease of operation, and cost are factored in, the use of an MOVPE apparatus is preferred.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters set forth herein or shown in the accompanying drawings are to be interpreted in an illustrative and non-limiting sense.

What is claimed is:

1. A nitride semiconductor deposition substrate comprising:

a low-temperature-deposited buffer layer having a composition of $Al_xGa_{1-x}N$, where $0 \leq x \leq 1$; and a single crystalline layer having a composition of $Al_yGa_{1-y}N$, where $0 < y \leq 1$, the single crystalline layer being deposited directly over the low-temperature-deposited buffer layer; and wherein:

the low-temperature-deposited buffer layer mole fraction x satisfies $(y-0.3) \leq x < y$.

2. The nitride semiconductor deposition substrate as claimed in claim 1, wherein the low-temperature-deposited buffer layer mole fraction x satisfies $(y-0.2) \leq x \leq (y-0.1)$.

3. The nitride semiconductor deposition substrate as claimed in claim 1, wherein the low-temperature-deposited buffer layer mole fraction x is equal to y-0.2.

4. The nitride semiconductor deposition substrate as claimed in claim 1, further comprising a GaN layer underlying the low-temperature deposited buffer layer.

5. The nitride semiconductor deposition substrate as claimed in claim 4, wherein the GaN layer is a low-temperature deposited GaN buffer layer.

6. The nitride semiconductor deposition substrate as claimed in claim 5, further comprising a single crystalline GaN layer disposed between the low-temperature deposited GaN buffer layer and the low-temperature-deposited buffer layer having a composition of $Al_xGa_{1-x}N$.

7. The nitride semiconductor deposition substrate as claimed in claim 4, further comprising a growth substrate underlying the GaN layer.

* * * * *